(12) United States Patent
Shrader et al.

(10) Patent No.: US 8,201,058 B2
(45) Date of Patent: Jun. 12, 2012

(54) METHOD AND APPARATUS FOR PARALLEL ECC ERROR LOCATION

(75) Inventors: Steven Shrader, Meridian, ID (US); Anujan Varma, Cupertino, CA (US); Mohit Mittal, Punjab (IN)

(73) Assignee: Cadence Design Systems, Inc., San Jose, CA (US)

( * ) Notice: Subject to any disclaimer, the term of this patent is extended or adjusted under 35 U.S.C. 154(b) by 1007 days.

(21) Appl. No.: 12/170,237

(22) Filed: Jul. 9, 2008

(65) Prior Publication Data

US 2010/0011247 A1    Jan. 14, 2010

(51) Int. Cl.
*H03M 13/00* (2006.01)
(52) U.S. Cl. .................. 714/781; 714/752; 714/785
(58) Field of Classification Search ............ 714/781, 714/752, 746, 748, 785, 751
See application file for complete search history.

(56) References Cited

U.S. PATENT DOCUMENTS

| | | | |
|---|---|---|---|
| 6,003,151 A * | 12/1999 | Chuang | 714/752 |
| 6,615,387 B1 * | 9/2003 | Williamson et al. | 714/785 |
| 7,831,882 B2 * | 11/2010 | Tsern et al. | 714/751 |

* cited by examiner

*Primary Examiner* — Fritz Alphonse
(74) *Attorney, Agent, or Firm* — Sawyer Law Group, P.C.

(57) ABSTRACT

An invention is provided for parallel ECC error location in a memory. The invention includes partitioning a set of field elements into w partitions. Then, for each of the w partitions of field elements, i) providing a set of r different field elements of the partition to r parallel search element. Next, in operation ii), each parallel search element computes a sum that is based on a set of coefficients of an error locator polynomial and the field element provided to the particular parallel search element. The set of field elements is advanced r field elements in $GF(2^m)$, and operations i) through iii) are repeated using the next r different field elements of the partition.

19 Claims, 6 Drawing Sheets

METHOD AND APPARATUS FOR PARALLEL ECC ERROR LOCATION

BACKGROUND OF THE INVENTION

1. Field of the Invention

This invention relates generally to error location, and more particularly to parallel error correction code based error location and error locator polynomial root determination.

2. Description of the Related Art

As use of electronic data continues to increase, so do requirements for data storage reliability. To protect against errors in data storage, electronic data systems typically incorporate error detection and correction schemes, often referred to as Error Correcting Codes (ECC). ECC is common in data storage, such as magnetic disk storage, magnetic tape storage, and other non-volatile memory storage that stores data when power is disconnected from the system, such as Phase-change memory (PCM) or Flash memory. In general, when writing data to storage, ECC data is associated in some manner with the actual user data. For example, when using a non-volatile memory such as Flash memory, ECC data often is stored in the memory along with the actual user data.

FIG. 1 is an illustration showing a typical prior art non-volatile memory arrangement 100 utilizing ECC data for data reliability checking. As illustrated in FIG. 1, a non-volatile memory 100 generally comprises a plurality of memory blocks 102, which generally is the smallest portion of memory that can be erased. Each memory block 102 generally comprises a fixed plurality of pages 104, which is the smallest size element that can be written or read from the non-volatile memory 100. Each page 104 typically is logically divided into two areas: a main area 106 and a spare area 108. It is in the spare area 108 where typical non-volatile memory systems store ECC data, such as the ECC check bits 110 illustrated in FIG. 1. The ECC check bits 110 generally are generated as the user data is being written to the memory. When the data is later read from memory, the ECC check bits 110 are utilized to determine if errors are present in the data, and if so, where the errors are located.

FIG. 2 is an illustration showing a conventional error detection and location arrangement 200 in a non-volatile memory. The conventional error detection and location arrangement 200 typically includes a check code generator 204 coupled to an error locator polynomial generator 208, which is coupled to an error locator 212. In operation, read data 202 is provided to the check code generator 204 from memory. The read data 202 generally includes both user data and ECC check bits generated as described previously. The check code generator 204 generates a syndrome polynomial 206 using received the read data 202. In general, the check code generator 204 generates ECC check bits for the received user data and compares the generated ECC check bits to the ECC check bits stored with the user data. If the two ECC check bits are the same, no errors are present. If not, a syndrome polynomial 206 is generated based on the generated ECC check bits.

The syndrome polynomial 206 is a unique encoded indication of where the errors are located within the user data. However, to find the actual location of the errors the syndrome polynomial 206 needs to be decoded. To facilitate decoding, the syndrome polynomial 206 is provided to an error locator polynomial generator 208. The error locator polynomial generator 208 generates an error locator polynomial 210 based on the syndrome polynomial 206. In this manner, the error locator polynomial 210 can be used to determine the actual locations of the errors by determining the roots of the error locator polynomial 210.

Once the error locator polynomial 210 is generated, the error locator polynomial 210 is provided to an error locator 212, which effectively determines the roots of the error locator polynomial 210. Although several methods can be utilized to determine the roots of the error locator polynomial 210, the conventional method examines each bit location in the user data to determine if the location satisfies the constraints of the error locator polynomial 210. If it does, the particular bit location contains an error, and if not, the particular bit location does not contain an error. Hence, conventional error locator arrangements perform a sequential search of the data, examining one bit location at a time to determine if the particular bit location satisfies the error locator polynomial 210 and thus contains an error. Unfortunately, such a sequential search can take an inordinate amount of time depending on the size of the data. Basically, the amount of time required is the number of clock cycles required to scan all the addresses that the scheme is capable of correcting. For example, when using a 512 byte block, 8192 cycles typically are required to complete the scan.

In view of the foregoing, there is a need for methods and apparatuses that reduce the number of clock cycles required to determine the location of errors present in data. The method and apparatuses should provide increased efficiency without requiring increased clock frequency, which generally requires a very high frequency clock that may not be easily available for this purpose and may also be too fast a clock to properly execute the required logic. In addition, the methods and apparatuses should not require asynchronous logic, which greatly increases the logic requirements by up to fifty times the amount of logic. In addition, the depth of such logic can require many additional clock cycles for the results to stabilize, which of course leads to control difficulties.

SUMMARY OF THE INVENTION

Broadly speaking, the present invention addresses these needs by providing methods and apparatuses that perform search operations in parallel to reduce the number of clock cycles required to determine the roots of the error locator polynomial of Bose-Chaudhuri-Hocquenghem (BCH) codes. For example, in one embodiment a method for obtaining error locations in a memory is disclosed. The method includes partitioning a set of field elements into w partitions. Then, for each of the w partitions of field elements, i) providing a set of r different field elements of the partition to r parallel search elements, where one field element is provided to each parallel search element. Next, in operation ii), each parallel search element computes a sum that is based on a set of coefficients of an error locator polynomial and the field element provided to the particular parallel search element. The method continues in operation iii) by advancing r field elements in $GF(2^m)$. Operations i) through iii) are repeated using the next r different field elements of the partition, such that each set of r field elements is processed in parallel, and each of the w partitions also is processed in parallel.

In a further embodiment, a parallel error locator root module for obtaining error locations in a memory is disclosed. The parallel error locator root module includes a mask generator configured to generate a mask of r bits indicating roots of the error locator polynomial. The parallel error locator root module also includes r parallel search elements in communication with the mask generator. Each parallel search element is configured to search a set of field elements in parallel by: i) computing a sum in parallel with remaining parallel search elements based on a set of coefficients of an error locator polynomial and a field element, where the field element is one of a set of r different field elements of the set of field elements, and ii) setting a particular mask bit in the mask generator when the calculated sum is equal to a predefined value, for example zero. Each cycle the provided field elements are advanced r field elements and operations i) and ii) are repeated using one of the next r different field elements of the set of field elements in each parallel search element until the entire set of field elements is searched. For example, each parallel search element can be configured to calculate $S=\sigma_0+\sigma_1\alpha_i+\sigma_2\alpha_i^2+\ldots+\sigma_t\alpha_i^t$, wherein S is the sum, t is the number of coefficients in the error locator polynomial, $\sigma_0, \sigma_1, \ldots, \sigma_t$ are the coefficients of the error locator polynomial, and $\alpha_i$ is the ith element of the set of field elements. A holding register storing coefficients of the error locator polynomial can also be included. The holding register is in communication with each parallel search element and provides the parallel search elements with the stored coefficients. In this case, a high order parallel search element can cycle output back to the holding register to further facilitate computing.

To achieve additional parallelism, parallel search logic for obtaining error locations in a memory is disclosed in a further embodiment of the present invention. The parallel search logic includes a plurality of parallel error locator root modules, wherein each parallel error locator root module is configured to search one of w partitions of a set of field elements in parallel. Each parallel error locator root module includes r parallel search elements as described above. Each parallel search element is configured to search the corresponding partition in parallel as described above, for example, by computing a sum based on a set of coefficients of the error locator polynomial and a field element that is one of a set of r different field elements of the partition. Thus, each parallel search element is provided with one of a set of r different field elements of the partition. Each cycle the provided field elements are advanced r field elements and operation i) is repeated using one of the next r different field elements of the partition in each parallel search element. As above, each parallel error locator root module can include a mask generator configured to generate a mask of r bits indicating found roots of the error locator polynomial. In this case, each parallel search element can be configured to set a particular mask bit in the mask generator when the calculated sum is equal to a predefined value, such as zero. For example, each parallel search element can be configured to calculate $S=\sigma_0+\sigma_1\alpha_i+\sigma_2\alpha_i^2+\ldots+\sigma_t\alpha_i^t$, wherein S is the sum, t is the number of coefficients in the error locator polynomial, $\sigma_0, \sigma_1, \ldots, \sigma_t$ are the coefficients of the error locator polynomial, and $\alpha_i$ is the ith element of partition being searched by the corresponding parallel error locator root module. In this manner, embodiments of the present invention reduce the runtime for obtaining roots of the error locator polynomial in $GF(2^m)$ by $2^{m-w-r}$, where w is the number of partitions, and r is the number of parallel search modules utilized. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for parallel ECC based error location and error locator polynomial root determination. Broadly speaking, embodiments of the present invention provide methods and apparatuses that perform Chien search operations in parallel to reduce the number of clock cycles required to determine the roots of the error locator polynomial of Bose-Chaudhuri-Hocquenghem (BCH) codes. As will be described in greater detail subsequently, embodiments of the present invention achieve parallelism both by performing parallel checks of adjacent bit locations and by dividing the search space into subspaces, each of which is searched separately in parallel.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
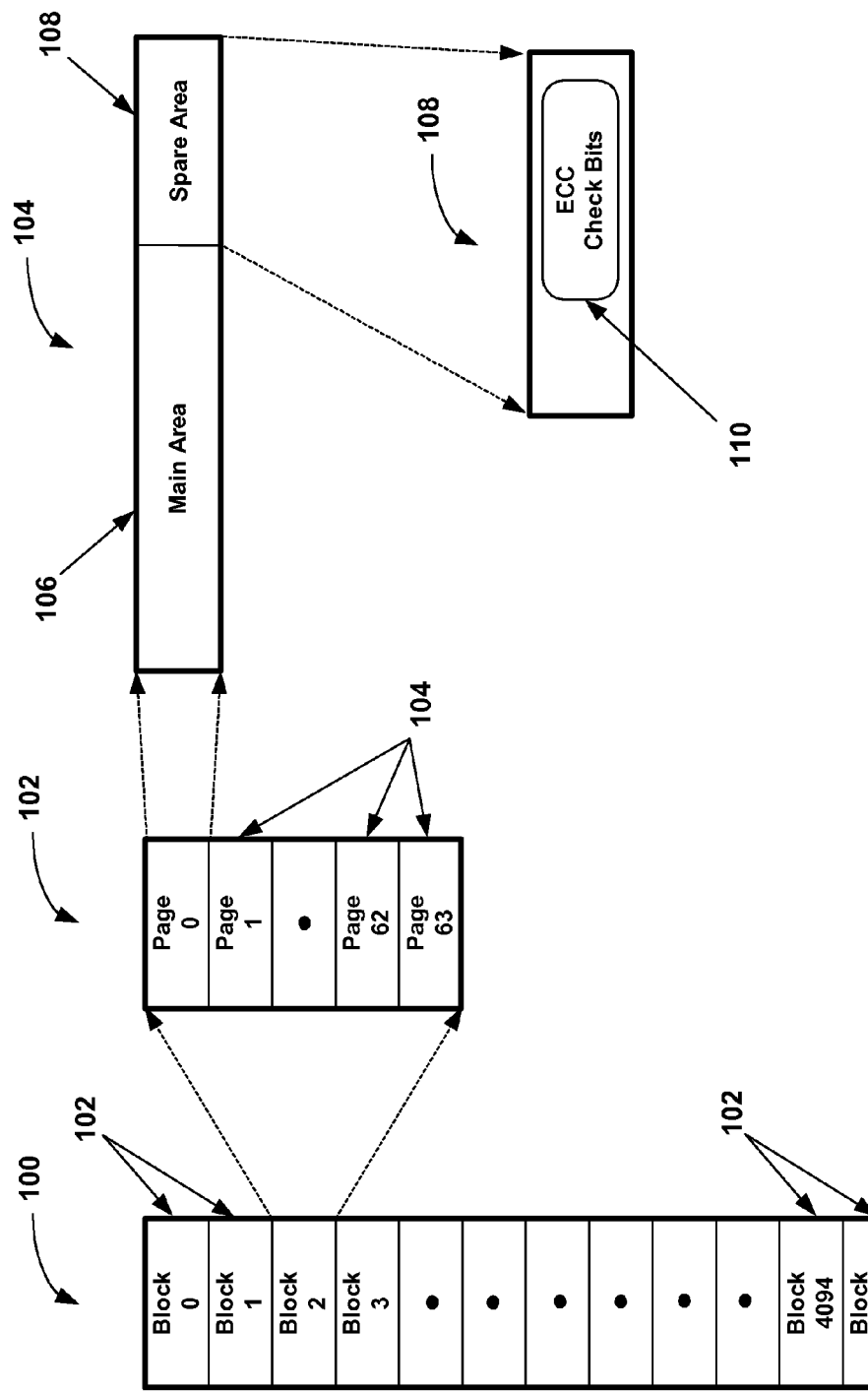
FIG. 1 is an illustration showing a typical prior art non-volatile memory arrangement utilizing ECC data for data reliability checking.
Figure 2:
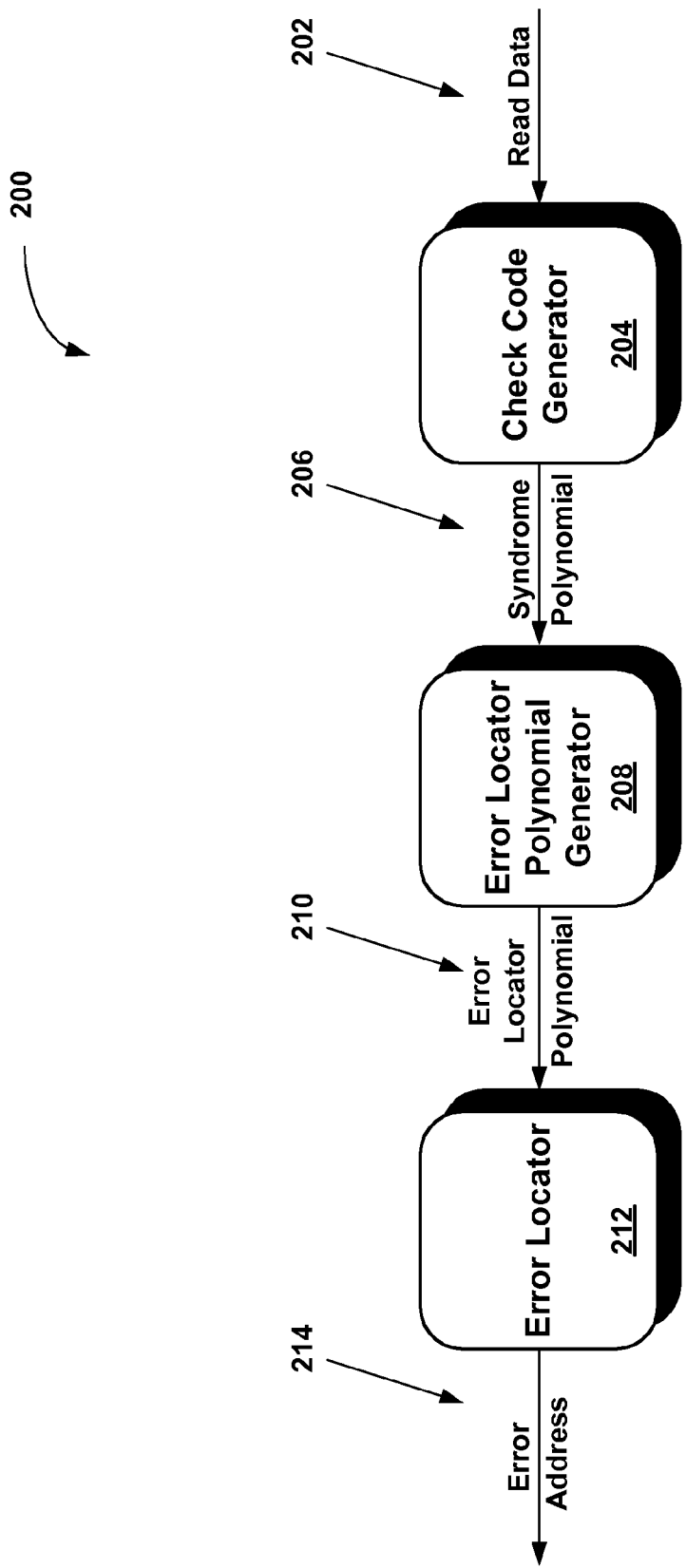
FIG. 2 is an illustration showing a conventional error detection and location arrangement 200 in a non-volatile memory.
Figure 3:
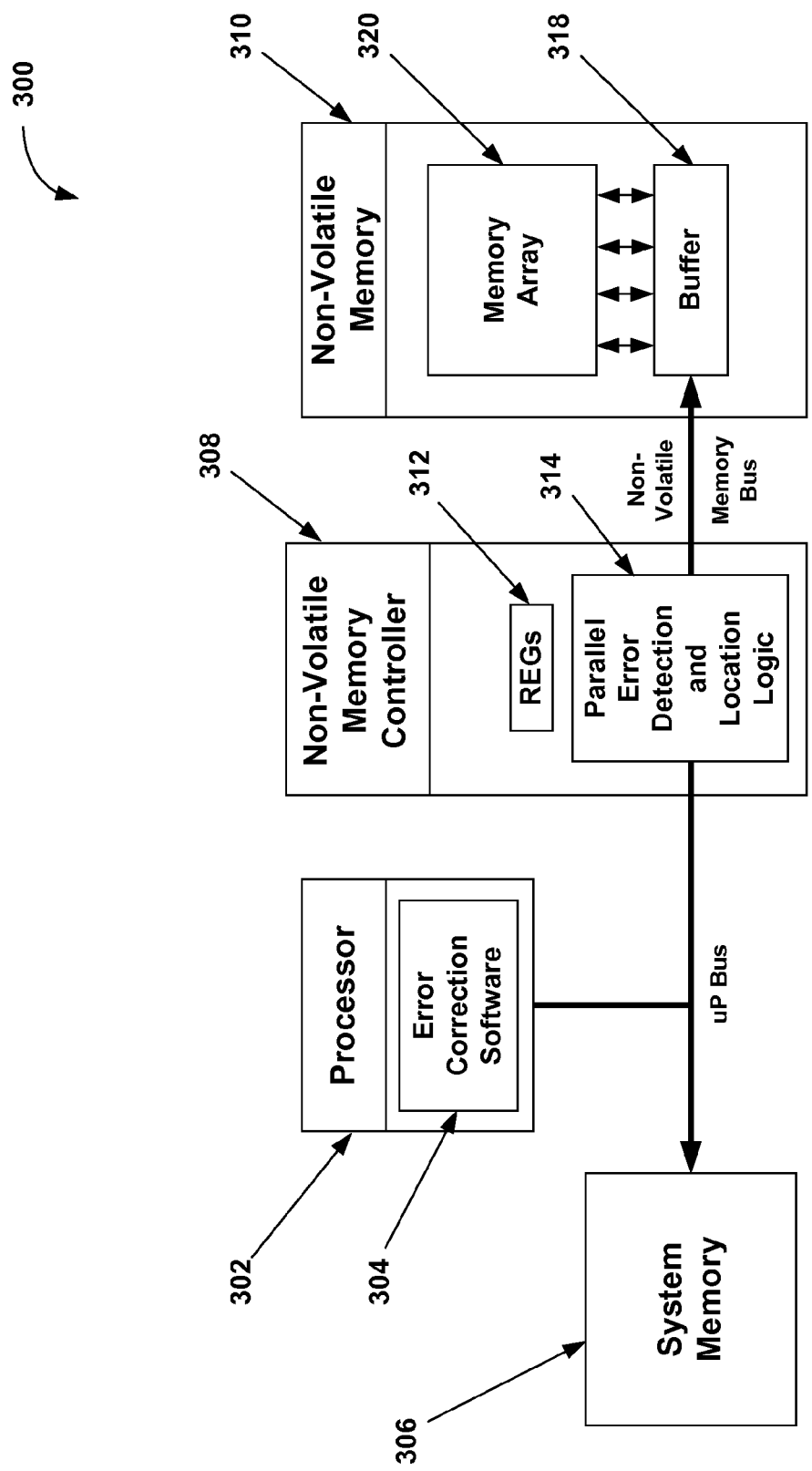
FIG. 3 is a diagram showing a system having parallel ECC error location logic, in accordance with an embodiment of the present invention.

FIG. 1 and FIG. 2 were described in terms of the prior art. FIG. 3 is a diagram showing a system 300 having parallel ECC error location logic, in accordance with an embodiment of the present invention. The system 300 includes a processor 302, executing error correction software 304, coupled to system memory 306. Also coupled to the processor 302 is a non-volatile memory controller 308, which is coupled to non-volatile memory 3 10. The non-volatile memory controller 308 includes a plurality of registers 312, and parallel error detection and location logic 314. The non-volatile memory 310 includes a buffer 318 and a memory array 320.

During normal operation, the processor 302 utilizes the non-volatile memory controller 308 to read and write data to the non-volatile memory 310. When writing data to the non-volatile memory 310, the data generally is transferred from the system memory 306, though the non-volatile memory controller 308, and into the buffer 318. When passing through the non-volatile memory controller 308, the data passes through the parallel error detection and location logic 314, which calculates a code (often called an error correction code or ECC data) that is appended to the data and stored along with the data in the buffer 318. The data then is transferred from the buffer 318 and stored into the non-volatile memory array 320. As mentioned previously, user data generally is stored in the main array of a page of memory, while the ECC data is stored in the spare area of the page.

When the data is later read from the non-volatile memory 310, the non-volatile memory controller 308 checks the data for errors using the parallel error detection and location logic 314. Similar to above, when reading data from the non-volatile memory 310, the data is transferred from the memory array 320 to the buffer 318. The non-volatile memory controller 308 then reads the data from the buffer 318, passes the data through the parallel error detection and location logic 314, and stores the data into the system memory 306.

Broadly speaking, while the data is being passed through the parallel error detection and location logic 314, the parallel error detection and location logic 314 calculates a new ECC code, which is compared to the ECC code that was stored with the data. If the new ECC code matches the stored ECC code, the data is error free. However, if the two ECC codes do not match, the parallel error detection and location logic 314 calculates the addresses of the errors and the error correction software 304 executing on the processor 302 attempts to correct the defects in the data, which is now stored in the system memory 306. However, unlike conventional error detection hardware, embodiments of the present invention utilize parallel ECC error location logic to calculate the addresses of any errors present in the data to reduce the number of clock cycles required to scan the data, as discussed next with respect to FIG. 4.

Figure 4:
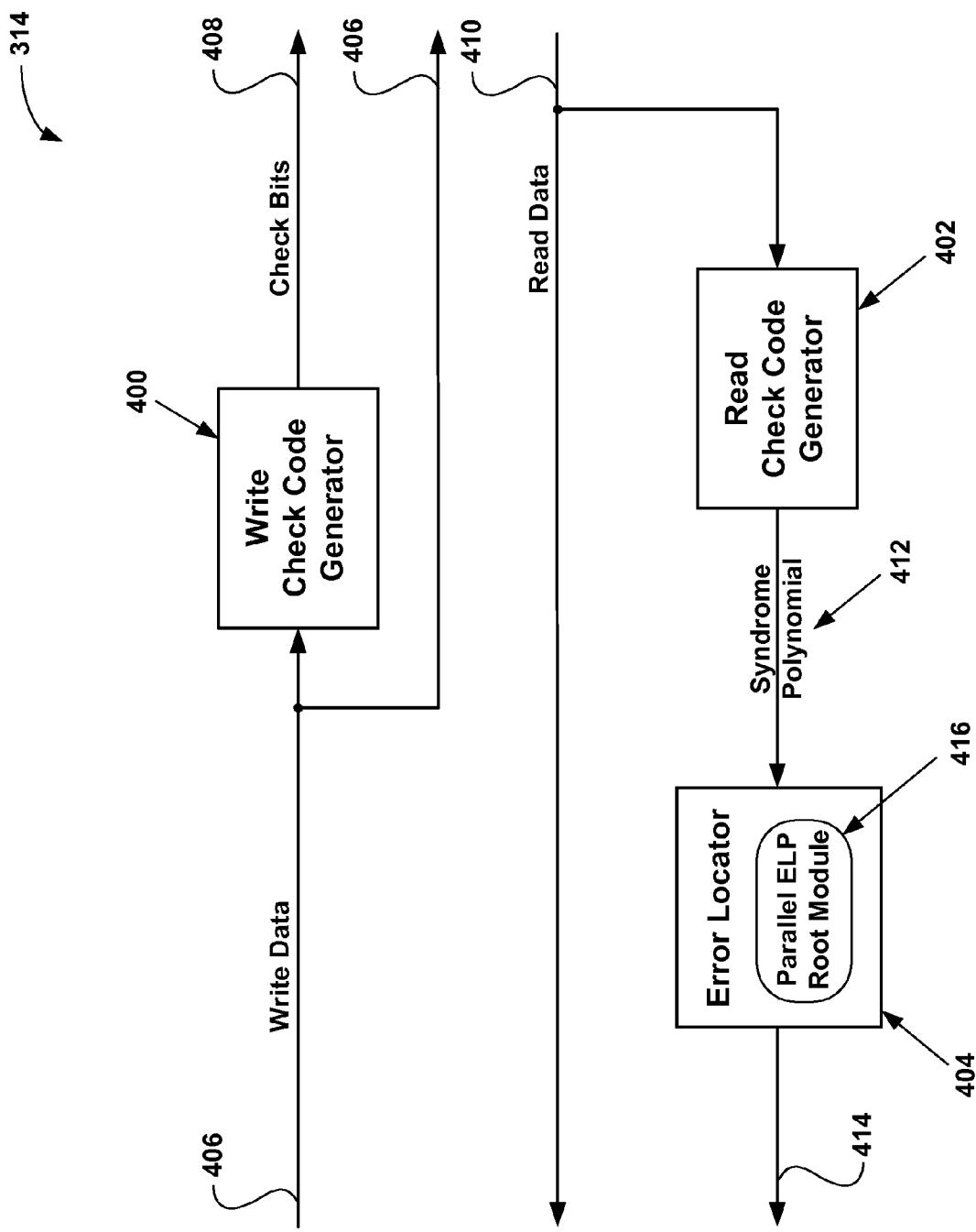
FIG. 4 is a block diagram showing parallel error detection and location logic utilizing parallel ECC detection logic to determine the roots of the error locator polynomial and determine error locations, in accordance with an embodiment of the present invention.

FIG. 4 is a block diagram showing parallel error detection and location logic 314 utilizing parallel ECC detection logic to determine the roots of the error locator polynomial and determine error locations, in accordance with an embodiment of the present invention. The parallel error detection and location logic 314 includes a write check code generator 400, a read check code generator 402, and an error locator 404. The write check code generator 400 is coupled to write data input 406 and a check bit output 408. The read check code generator 402 is coupled to a read data input 410 and a syndrome polynomial output 412, which is also coupled to the input of the error locator 404. In addition, the error locator 404 provides an error address output 414. As will be discussed in greater detail subsequently, the error locator 404 includes one or more parallel ECC error locator polynomial root modules 416 to facilitate error location determination. Although FIG. 4 will be described in terms of a write check code generator and a read check code generator, it should be noted that both the write check code generator and a read check code generator can comprise the same hardware or two separate sets of hardware, depending on the needs and design requirements of a particular situation.

In operation, data being written to the non-volatile memory is provided on the write data input 406, which provides the data to both the write check code generator 400 and the non-volatile memory buffer. The write check code generator 400 then generates an ECC code for the data, which is provided to the check bit output 408. As described above, the data is eventually stored in the main area of non-volatile memory, while the ECC code data generally is stored in the spare area of non-volatile memory. However, it should be noted that the embodiments of the present invention can be utilized with any configuration of user data and ECC code data storage, as need by each particular design.

When the data is later read from the non-volatile memory, the data is provided to system memory and the read check code generator 402 via the read data input 410. The read check code generator 402 also receives the stored ECC code previously stored with the data. The read check code generator 402 then generates an ECC code for the read data in manner similar to that described above with respect to the write check code generator 400. However, the read check code generator 402 also utilizes the previously stored ECC code and the newly generated ECC code to calculate a syndrome polynomial for the data.

The syndrome polynomial 412 is utilized to find errors in the read data, and can be based on any error detection algorithm, such as Reed-Solomon codes or BCH codes. In general, the syndrome polynomial is zero when no errors are present in the read data, which generally occurs when the newly generated ECC code matches the ECC code previously stored with the read data. However, if the syndrome polynomial is a non-zero value, errors are present in the read data and the error locator 404 utilizes the syndrome polynomial to locate the addresses of the error or errors in the read data.

To decode the syndrome polynomial, the error locator 404 receives the syndrome polynomial 412 from the read check generator 402 and generates an error locator polynomial based on the syndrome polynomial 412. The error locator polynomial then is provided to one or more parallel error locator polynomial (ELP) root modules 416, which determine the roots of the error locator polynomial. For example, in one embodiment, the parallel ELP root module 416 utilizes a Chien Search to calculate the roots of the error locator polynomial, and determine the addresses of the error or errors in the read data, as described next with respect to FIG. 5.

Figure 5:
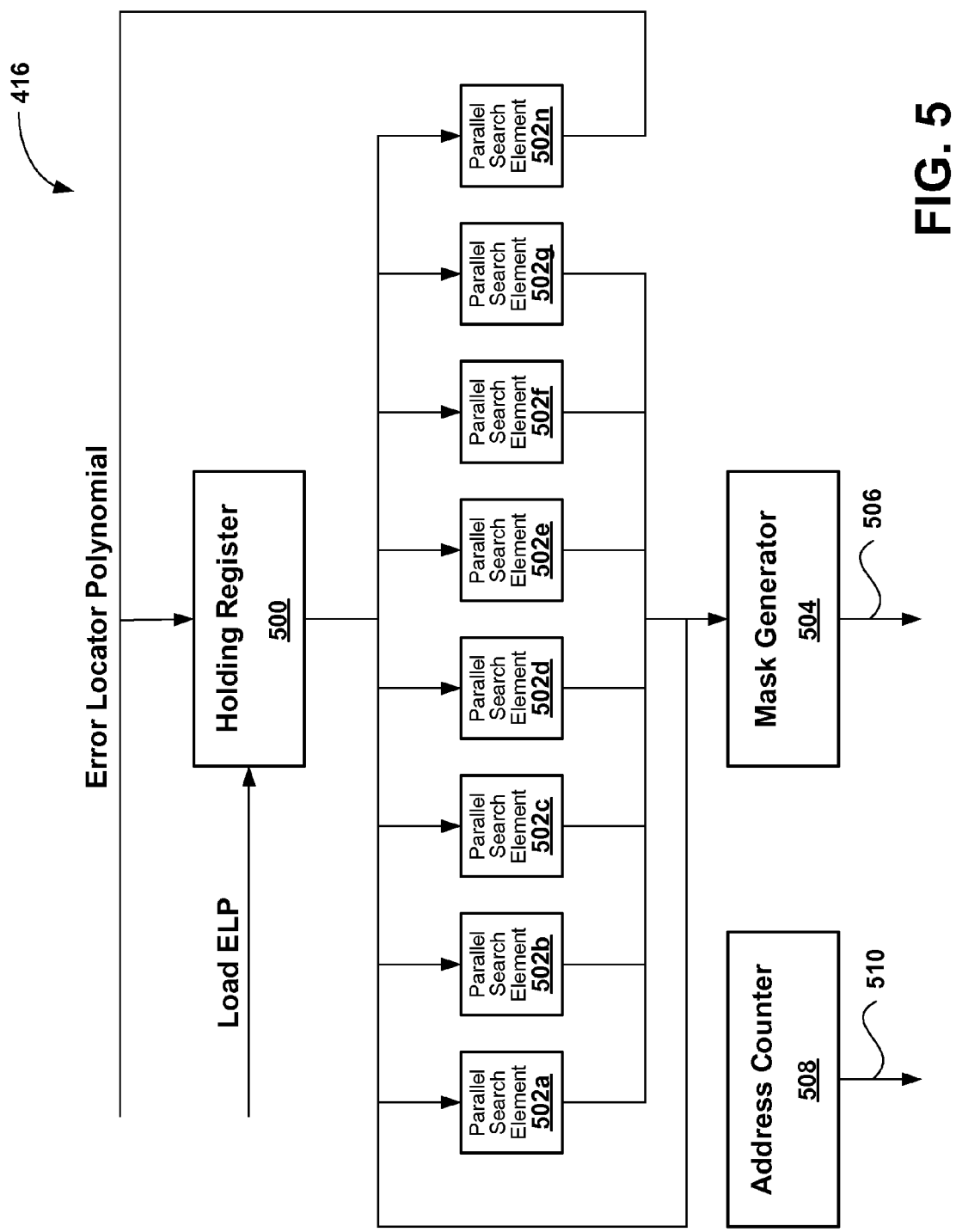
FIG. 5 is a block diagram showing an exemplary parallel error locator polynomial root module, in accordance with an embodiment of the present invention.

FIG. 5 is a block diagram showing an exemplary parallel error locator polynomial (FLP) root module 416, in accordance with an embodiment of the present invention. The parallel FLP root module 416 includes a holding register 500 coupled to a plurality of parallel search elements 502a-502n such that a high order parallel search element 502n provides a cyclic output back to the holding register 500. The parallel search elements 502a-502n-1 are further coupled to a mask generator 504, which provides a mask output 506. In addition, an address counter 508 is provided to associate a particular address with each set of mask bits provided from the mask output 506. Although FIG. 5 illustrates eight parallel search elements 502a-502n, it should be noted that any number of parallel search elements can be included in the system, depending on the properties of the FCC codes utilized, the size of the data being protected, and cycle reduction desired.

Utilizing a Chien search algorithm, the parallel FLP root module 416 scans a number of bit address locations equal to the number of parallel search elements 502a-502n included in the system during a single clock cycle. For example, the parallel FLP root module 416 of FIG. 5 includes eight parallel search elements 502a-502n, and thus scans eight bit address locations each clock cycle. As is well known in the art, a Chien search algorithm can be utilized to find the roots of an error locator polynomial of BCH codes. Such an algorithm is disclosed, for example, in R. T. Chien, "Cyclic Decoding Procedure for the Bose-Chaudhuri-Hocquenghem Codes," IEEE Transactions on Information Theory, Vol. JT-10, pp. 357-363, October 1964, which is hereby incorporated by reference in its entirety. By way of example, a t-error correcting binary BCH code can be designed in $GF(2^m)$ where:

$$\text{Length of codeword } n \leq 2^r-1, \text{ and} \qquad (1)$$

$$\text{Length of information field } k=n-mt \qquad (2)$$

For example, a BCH code capable of correcting up to 8 bit errors can be designed with m=13, k=4096, and n=4200. The location of errors in a received BCH codeword can be determined by first determining a set of 2t syndromes $S_0, S_1, \ldots, S_{2t-1}$, which are the coefficients of the syndrome polynomial 412. Second, an error locator polynomial is generated from the syndrome polynomial using any appropriate algorithm, such as the Berlekamp Method, which is well known to those skilled in the art. Third, if $\sigma_0, \sigma_1, \ldots, \sigma_t$ are the coefficients of the error locator polynomial, the roots of the error locator polynomial provide the locations of the bit errors. As mentioned above, one method to determine the roots of the error locator polynomial is the Chien Search algorithm.

As is well known, the Chien Search algorithm starts with an initial element $\alpha$ of $GF(2^m)$. Then, the sum of $\sigma_0, +\sigma_1\alpha+\sigma_2\alpha^2+\ldots+\sigma_t\alpha^t$ is computed in $GF(2^m)$. If the sum=0, the element $\alpha$ corresponds to one of the roots of the error locator polynomial. After outputting any error location found, $\alpha$ is advanced to the next element in $GF(2^m)$. Once the entire $GF(2^m)$ space is searched, the algorithm is complete.

Embodiments of the present invention increase efficiency by calculating the sum $\sigma_0+\sigma_1\alpha+\sigma_2\alpha^2+\ldots+\sigma_t\alpha^t$, for a plurality of different values of $\alpha$ in $GF(2^m)$ during a single clock cycle. The different values of $\alpha$ in $GF(2^m)$ can be consecutive values or non-consecutive values, such as a previous value or every eighth value. Initially, the error locator polynomial is stored in the holding register 500. The holding register 500 provides the error locator polynomial to the first parallel computing element 502a. All computing elements 500a-500n use the same holding register and all work on the same clock cycle. Computing elements 502a-502n are computed in parallel and their outputs are available on the next clock cycle. Computing element 502n is used to create the next value for the holding register. The values of computing elements 502a-502n-1 are checked for the sum=0 to discover root information. Hence, the number of different values of $\alpha$ in $GF(2^m)$ processed during a clock cycle is equal to the number of parallel search elements 502a-502n that are included in the system. For example, in the example of FIG. 5, eight different values of $\alpha$ are processed each clock cycle.

Broadly speaking, each parallel search element 502a-502n calculates the sum $S=\sigma_0+\sigma_1\alpha,+\sigma_2\alpha^2+\ldots+\sigma_t\alpha^t$, for a particular value of $\alpha$ being processed each clock cycle. That is, the parallel search elements 502a-502n together calculate:

$$S_0=\sigma_0+\sigma_1\alpha_0,+\sigma_2\alpha_0^2+\ldots+\sigma_t\alpha_0^t$$

$$S_1=\sigma_0+\sigma_1\alpha_1,+\sigma_2\alpha_1^2+\ldots+\sigma_t\alpha_1^t$$

$$S_{r-1}=\sigma_0+\sigma_1\alpha_{r-1},+\sigma_2\alpha_{r-1}^2+\ldots+\sigma_t\alpha_{r-1}^t \quad (3)$$

where r=the number of parallel search elements 502a-502n included in the system, and thus the number of values of $\alpha$ in $GF(2^m)$ processed during a clock cycle. Referring to FIG. 5, parallel search element 502a calculates $S_0$, parallel search element 502b calculates $S_1$, parallel search element 502c calculates $S_2$, on to parallel search element 502n, which calculates $S_{r-1}$. When any parallel search element 502a-502n calculates a sum=0, the corresponding mask bit in the mask generator 504 is set. If any mask bit in the mask generator 504 is set, one of the parallel computing elements 502a-502n has found a root to the error locator polynomial, and thus has determined a location of an error.

In this manner, the mask generator 504 can record as many roots as there are parallel search elements 502a-502n each clock cycle. In addition, the address counter 506 is incremented each clock cycle. Thus, the address counter 508 provides an indication of the byte address of a located error via the address counter output 510 and the mask output 506 provide and indication of the bit address within a byte of a located error. That is, for each set mask bit in the mask output 506, the particular element (i in $GF(2^m)$ corresponding to the set mask bit corresponds to the location of an error.

Once the mask generator 504 has generated the mask output 506, the next clock cycle occurs and the particular element $\alpha$ stored in each parallel search element 502a-502n is advanced in $GF(2^m)$ by r steps. That is, element $\alpha$ is advanced in $GF(2^m)$ by a number of steps equal to the total number parallel search element 502a-502n included in system. Once all elements $\alpha$ are advanced, each parallel search element 502a-502n calculates the appropriate sum $S=\sigma_0+\sigma_1\alpha,+\sigma_2\alpha^2+\ldots+\sigma_t\alpha^t$, as described above. Additional parallelism can be obtained by further dividing the search space $GF(2^m)$ into a plurality of partitions and searching each partition in parallel utilizing a plurality of parallel ELP root modules 416, as illustrated next with reference to FIG. 6.

Figure 6:
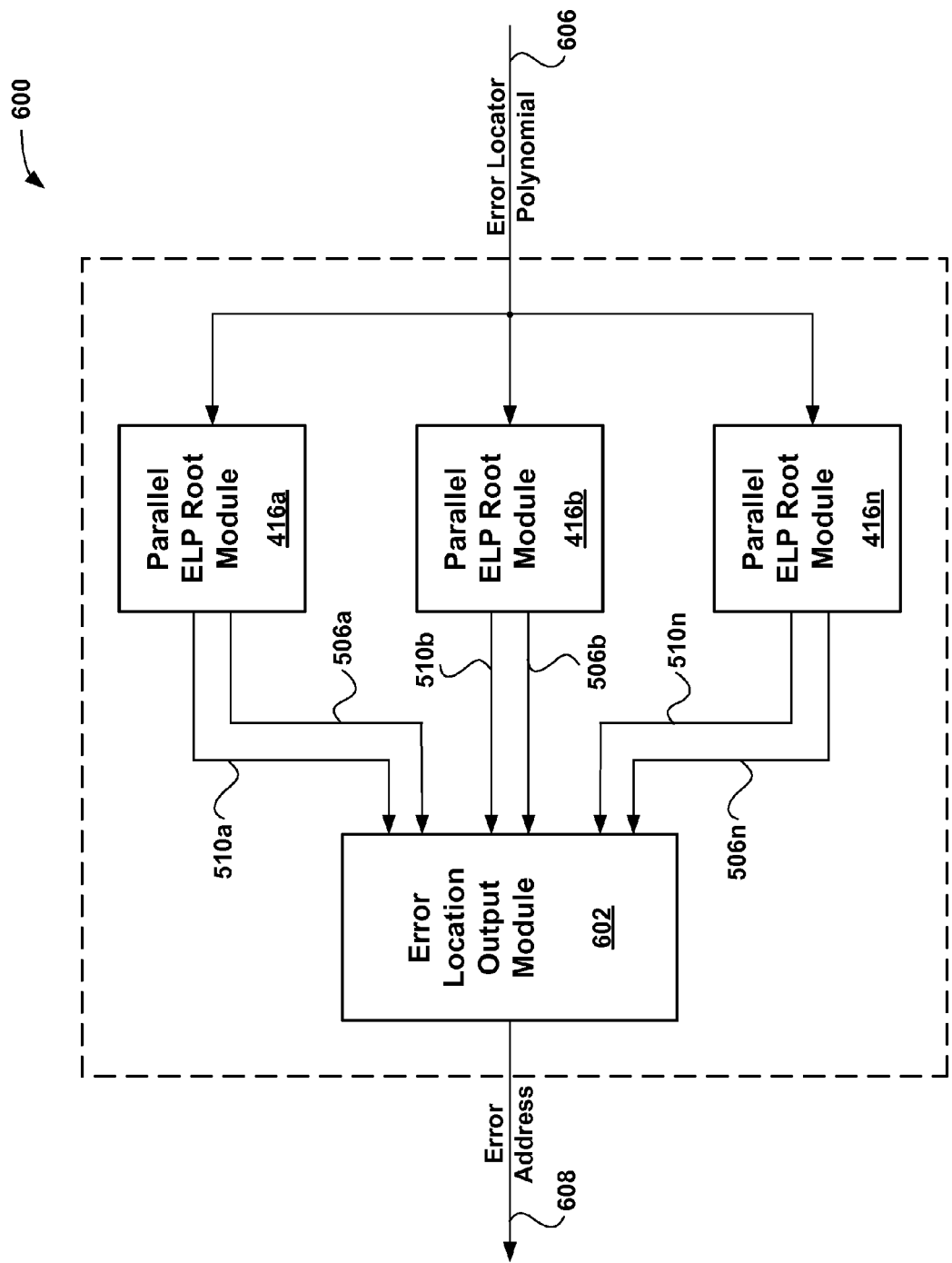
FIG. 6 is a block diagram showing parallel search logic including a plurality of parallel ELP root modules 416, each searching separate partitions of the total search space $GF(2^m)$, in accordance with an embodiment of the present invention.

FIG. 6 is a block diagram showing parallel search logic 600 including a plurality of parallel ELP root modules 416, each searching separate partitions of the total search space $GF(2^m)$, in accordance with an embodiment of the present invention. The parallel search logic 600 includes a plurality of parallel ELP root modules 416a-416n, each coupled to an error location output module 602. As illustrated in FIG. 6, each parallel ELP root module 416a-416n receives the error locator polynomial 606 and provides an address counter output 510a-510n and a mask output 506a-506n to the error location output module 602. Although the exemplary parallel search logic of FIG. 6 illustrates utilizing three parallel ELP root modules 416a-416n, it should be noted that any number of parallel ELP root modules 416 may be included in the parallel search logic 600 depending on the on the properties of the ECC codes utilized, the size of the data being protected, and cycle reduction desired.

Broadly speaking, the plurality parallel of ELP root modules 416a-416n operate by dividing the search space $GF(2^m)$ into a plurality of partitions and having each parallel ELP root module 416a-416n perform search operations on a separate partition. The partitions may be of equal or unequal size. For example, if the search space $GF(2^m)$ is divided into w partitions, partition i can begin from an initial element $\alpha_i$ and be searched for all the roots of the error locator polynomial 606 in a region of $GF(2^m)$ of size $2^{(m-w)}$.

Each parallel ELP root module 416a-416n searches a separate partition. For example, initially the error locator polynomial 606 is provided to each parallel ELP root module 416a-416n. In addition, each parallel ELP root module 416a-416n is assigned a particular partition i to search in parallel with the remaining parallel ELP root modules 416a-416n. Then, each parallel ELP root module 416a-416n searches the respective partition i of search space $GF(2^m)$ assigned to the particular parallel ELP root module 416a-416n. Each clock cycle, the resulting mask output 506a-506n and address counter output 510a-510n is provided to the error location output module 602, which processes the received data and provides any found error locations to the error address output 608. Utilizing the embodiment of FIG. 6, the runtime for obtaining roots of the error locator polynomial in $GF(2^m)$ is reduced by $2^{m-w-r}$, where w is the number of partitions, and r is the number of parallel search modules utilized.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for obtaining error locations in a memory, comprising the operations of:
   partitioning a set of field elements into one or more partitions;
   for each of the partitions of field elements, i) providing a set of r different field elements of the partition into r parallel search elements, wherein each parallel search element is provided with one field element;

ii) computing a plurality of sums using the plurality of parallel search elements, wherein each sum computed by each parallel search element is based on a set of coefficients of an error locator polynomial and the provided field element; and iii) repeating operations i) t and ii) using another set of r different field elements of the partition, wherein each set of r different field elements is processed in parallel, and wherein each of the partitions is processed in parallel; and providing the coefficients of the error locator polynomial to a holding register.

2. A method as recited in clam 1, further comprising the operation of indicating a root of the error locator polynomial when any sum is equal to a predefined value.

3. A method as recited in claim 2, further comprising the operation of setting a mask bit corresponding to a particular parallel search element when the particular parallel search element calculates a sum equal to the predefined value.

4. A method as recited in claim 3, wherein the mask bit is part of a mask that includes r bits, and wherein the mask bits of the mask are processed in parallel.

5. A method as recited in claim 2, wherein the predefined number is zero.

6. A method as recited in claim 1, wherein each parallel search element calculates $S=\sigma 0+\sigma 1\alpha i, +\sigma 2\alpha i2+ \ldots +\sigma t\alpha it$, wherein S is the sum, t is the number of coefficients in the error locator polynomial, $\sigma 0, \sigma 1, \ldots, \sigma t$ are the coefficients of the error locator polynomial, and $\alpha i$ is the ith element of partition.

7. A method as recited in claim 1, further comprising the operation of providing the coefficients of the error locator polynomial to a holding register, wherein the holding register is in communication with each parallel search element.

8. Parallel search logic for obtaining error locations in a memory, comprising:

a plurality of parallel error locator root modules, wherein each parallel error locator root module is configured to search one of a plurality of partitions of a set of field elements in parallel, and wherein each parallel error locator root module includes:

a plurality of parallel search elements, each parallel search element configured to search the corresponding partition in parallel by:

i) computing a sum based on a set of coefficients of an error locator polynomial and a field element, wherein the field element is one of a set of different field elements of the partition and each parallel search element is provided with one of a set of field elements of the partition, wherein operation i) is repeated and wherein each parallel search element is provided with one of a second set of different field elements of the partition.

9. Parallel search logic as recited in claim 8, wherein each parallel error locator root module includes a mask generator configured to generate a mask indicating found roots of the error locator polynomial.

10. Parallel search logic as recited in claim 9, wherein each parallel search element is further configured to set a particular mask bit in the mask generator when the calculated sum is equal to a predefined value.

11. Parallel search logic as recited in claim 10, wherein the predefined number is zero.

12. Parallel search logic as recited in claim 8, wherein each parallel search element is configured to calculate $S=\sigma 0+\sigma 1\alpha i, +\sigma 2\alpha i2+ \ldots +\sigma t\alpha it$, wherein S is the sum, t is the number of coefficients in the error locator polynomial, $\sigma 0, \sigma 1, \ldots, \sigma t$ are the coefficients of the error locator polynomial, and $\alpha i$ is the ith element of partition being searched by the corresponding parallel error locator root module.

13. Parallel search logic as recited in claim 8, wherein each parallel error locator root module further comprises a holding register that stores coefficients of the error locator polynomial, wherein the holding register is in communication with each parallel search element.

14. A parallel error locator root module for obtaining error locations in a memory, comprising:

a mask generator configured to generate a mask of bits indicating roots of the error locator polynomial; and a plurality of parallel search elements in communication with the mask generator, each parallel search element being configured to search a set of field elements in parallel by:

i) computing a sum in parallel with remaining parallel search elements based on a set of coefficients of an error locator polynomial and a field element, wherein the field element is one of a set of different field elements of the set of field elements; and ii) setting a particular mask bit in the mask generator when the calculated sum is equal to a predefined value.

15. A parallel error locator root module as recited in claim 14, wherein operations i) and ii) are repeated using one of a second set of different field elements of the set of field elements in each parallel search element until the entire set of field elements is searched.

16. A parallel error locator root module as recited in claim 14, wherein the predefined number is zero.

17. A parallel error locator root module as recited in claim 14, wherein each parallel search element is configured to calculate $S=\sigma 0+\sigma 1\alpha i, +\sigma 2\alpha i2 + \ldots +\sigma t\alpha it$, wherein S is the sum, t is the number of coefficients in the error locator polynomial, $\sigma 0, \sigma 1, \ldots, \sigma t$ are the coefficients of the error locator polynomial, and $\alpha i$ is the ith element of the set of field elements.

18. A parallel error locator root module as recited in claim 14, further comprising a holding register in communication with each parallel search element, the holding register storing coefficients of the error locator polynomial.

19. A parallel error locator root module as recited in claim 18, wherein a high order parallel search element cycles output back to the holding register.

* * * * *